US010644018B2

(12) United States Patent
Lee et al.

(10) Patent No.: US 10,644,018 B2
(45) Date of Patent: May 5, 2020

(54) 3D MEMORY HAVING PLURAL LOWER SELECT GATES

(71) Applicant: MACRONIX INTERNATIONAL CO., LTD., Hsinchu (TW)

(72) Inventors: Chih-Wei Lee, New Taipei (TW); Cheng-Hsien Cheng, Yunlin (TW); Shaw-Hung Ku, Taipei (TW); Atsuhiro Suzuki, Hsincu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 72 days.

(21) Appl. No.: 15/951,776

(22) Filed: Apr. 12, 2018

(65) Prior Publication Data
US 2019/0319033 A1    Oct. 17, 2019

(51) Int. Cl.
*H01L 27/1157* (2017.01)
*G11C 16/08* (2006.01)
*G11C 16/04* (2006.01)
*H01L 27/11582* (2017.01)

(52) U.S. Cl.
CPC ...... *H01L 27/1157* (2013.01); *G11C 16/0483* (2013.01); *G11C 16/08* (2013.01); *H01L 27/11582* (2013.01)

(58) Field of Classification Search
CPC .......... H01L 27/1157; H01L 27/11582; G11C 16/0483; G11C 16/08
USPC ....................................................... 257/324
See application file for complete search history.

(56) References Cited

U.S. PATENT DOCUMENTS

| 5,864,157 | A  | 1/1999  | Fu           |
| 6,759,684 | B2 | 7/2004  | Fukuda et al. |
| 8,553,466 | B2 | 10/2013 | Han et al.   |
| 9,183,940 | B2 | 11/2015 | Lee          |
| 9,361,997 | B2 | 6/2016  | Lee          |
| 9,373,632 | B2 | 6/2016  | Chen         |
| 9,437,306 | B2 | 9/2016  | Lee          |
| 9,443,579 | B2 | 9/2016  | Lee          |

(Continued)

FOREIGN PATENT DOCUMENTS

| CN | 105374388 A | 3/2016  |
| CN | 106169307 A | 11/2016 |

(Continued)

OTHER PUBLICATIONS

Erh-Kun Lai et al. "A Multi-Layer Stackable Thin-Film Transistor (TFT) NAND-Type Flash Memory," 2006 IEEE, pp. 1-4.

(Continued)

*Primary Examiner* — Hrayr A Sayadian
(74) *Attorney, Agent, or Firm* — Haynes Beffel & Wolfeld LLP

(57) ABSTRACT

A 3D NAND memory on a single integrated circuit is described including a block of vertical NAND strings, including a plurality of sub-blocks. Sub-blocks in the plurality of sub-blocks each comprise an upper select line in an upper level; word lines in intermediate levels below the upper level; a first lower select line in a first lower level below the intermediate levels; a second lower select line in a second lower level below the first lower level. A reference conductor can be disposed below the block. Bit lines are disposed over the block. Control circuitry applies voltages to the upper select lines, to the word lines and to the first and second lower select lines in the plurality of sub-blocks in various combinations for memory operations.

15 Claims, 13 Drawing Sheets

(56) References Cited

U.S. PATENT DOCUMENTS

| | | |
|---|---|---|
| 9,524,980 B2 | 12/2016 | Lue |
| 9,659,636 B2 | 5/2017 | Lee |
| 9,698,156 B2 | 7/2017 | Lue |
| 9,721,668 B2 | 8/2017 | Yeh et al. |
| 2016/0111162 A1 | 4/2016 | Lee |
| 2017/0148517 A1 | 5/2017 | Harari |
| 2017/0186758 A1 | 6/2017 | Lee et al. |

FOREIGN PATENT DOCUMENTS

| | | |
|---|---|---|
| TW | 201110121 A | 3/2011 |
| TW | 201135737 A | 10/2011 |
| TW | 201635290 A | 10/2016 |

OTHER PUBLICATIONS

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.
Katsumata et al., "Pipe-shaped BiCS Flash Memory with 16 Stacked Layers and Multi-Level-Cell Operation for Ultra High Density Storage Devices", 2009 Sypmposium on VLSI technology Digest of Technical Papers, p. 136-137.

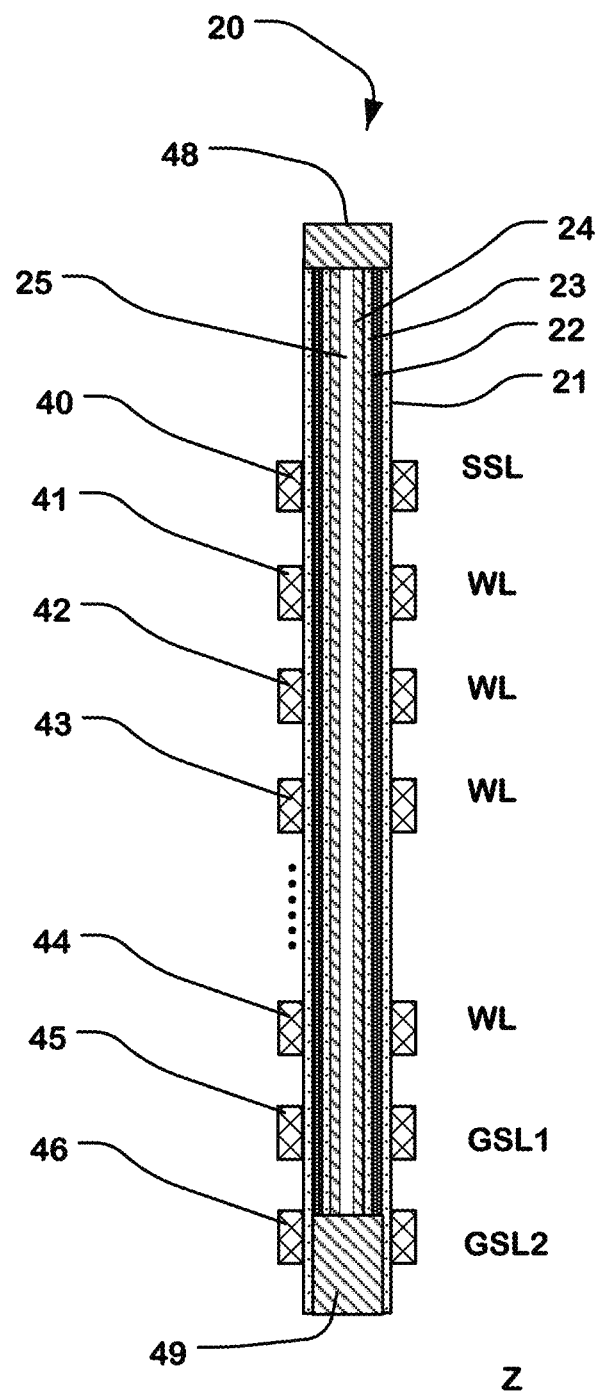
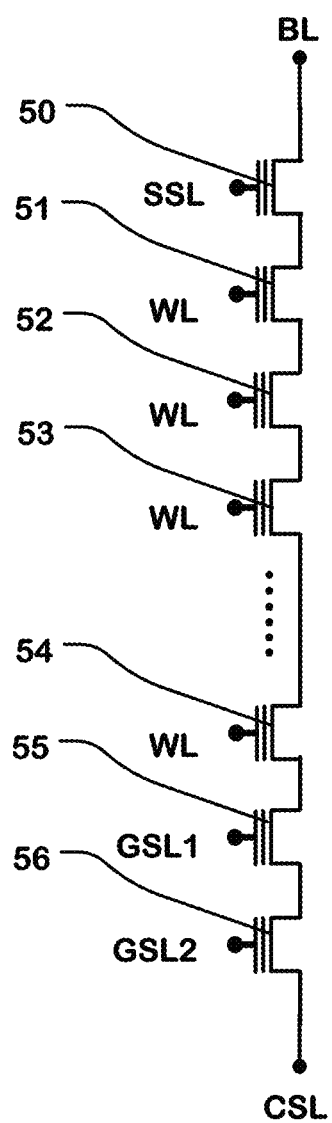
FIG. 1A
FIG. 1B

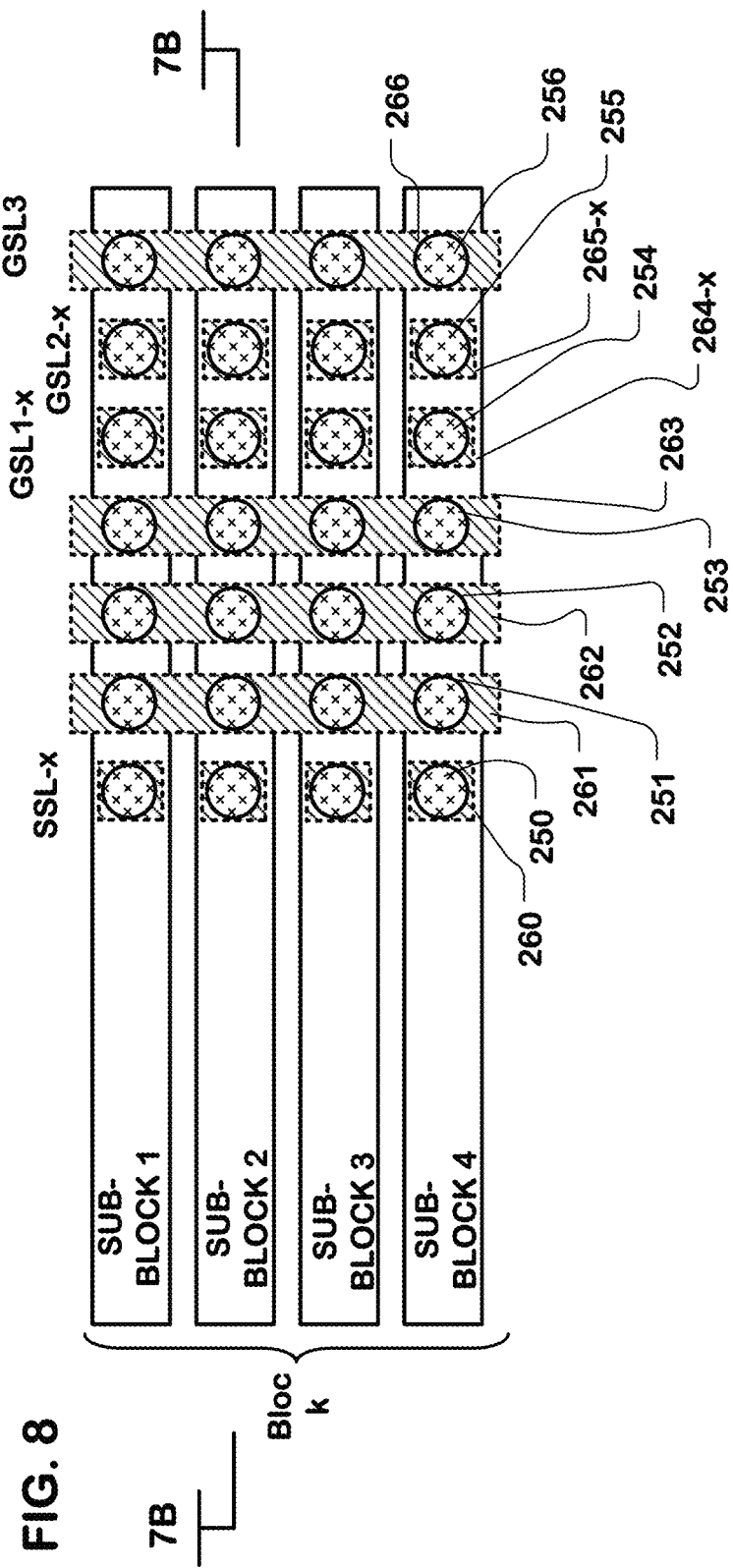

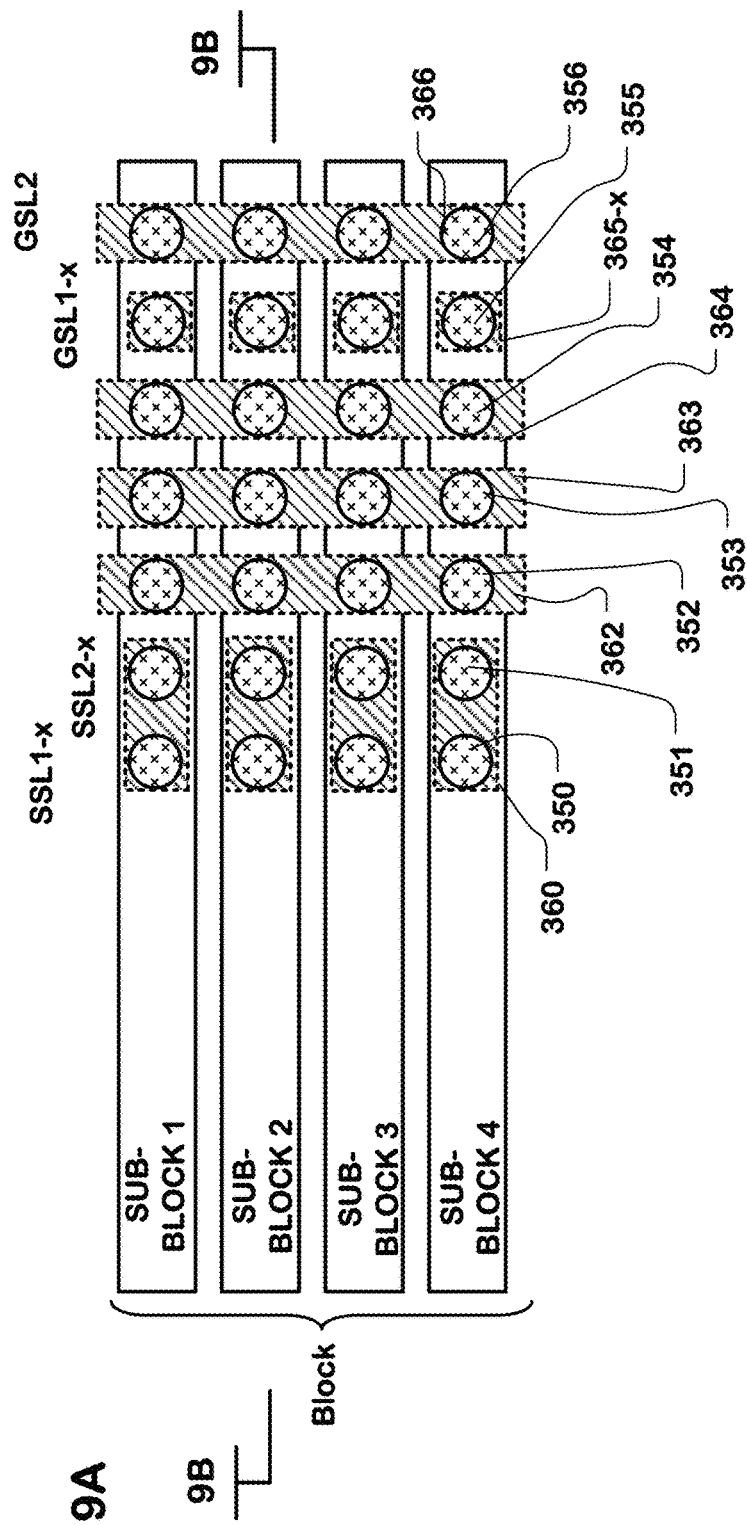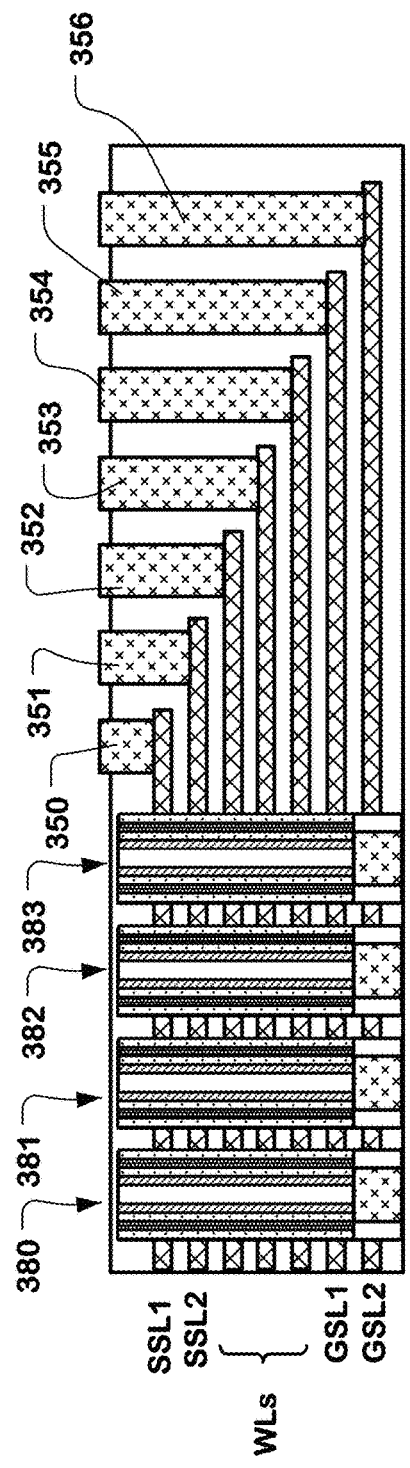
FIG. 9A
FIG. 9B

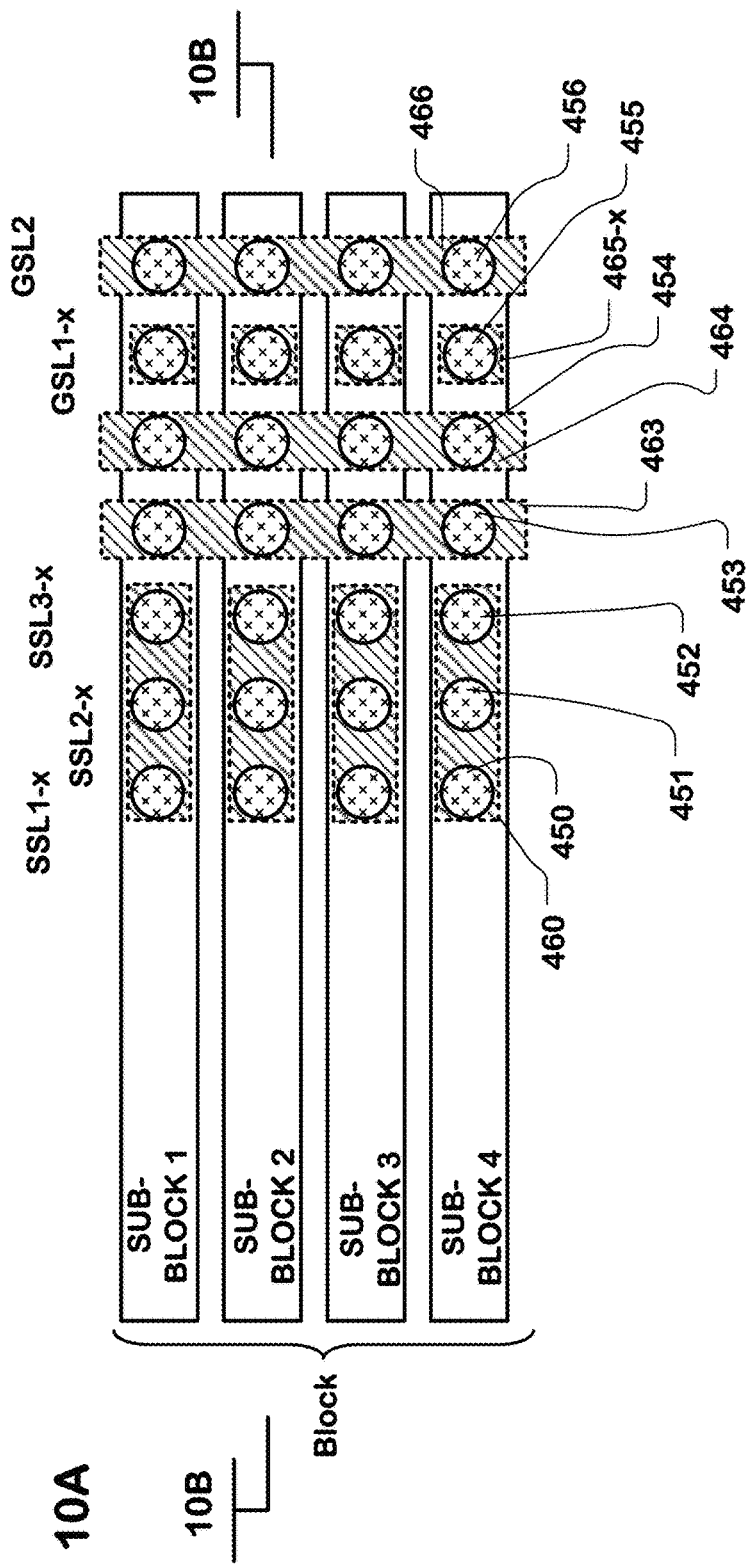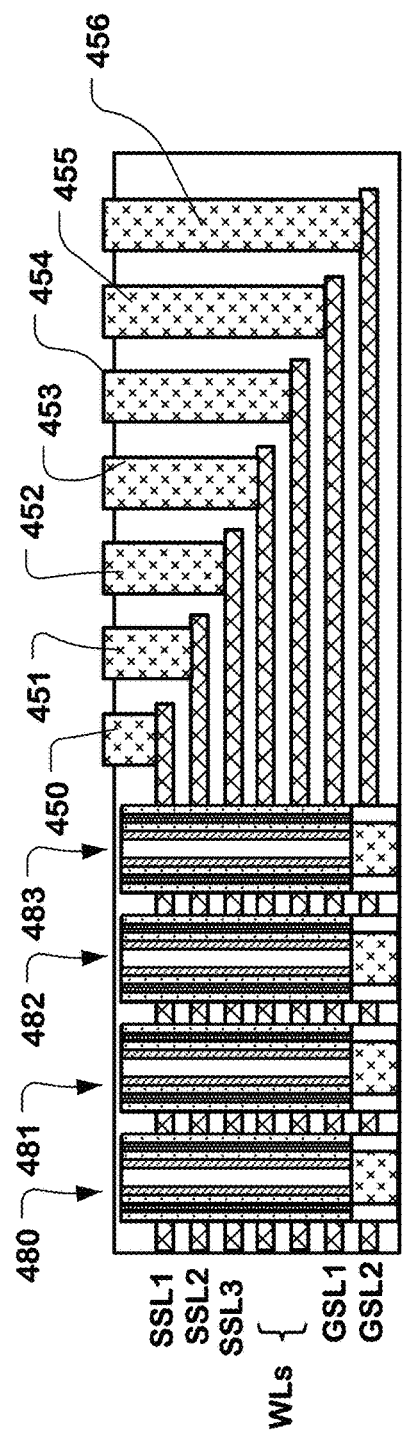

3D MEMORY HAVING PLURAL LOWER SELECT GATES

BACKGROUND

Field

The present invention relates to 3D memory structures, and particularly the 3D vertical NAND memory.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009 (Katsumata publication). The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel structure for the NAND gate, with a lower select gate adjacent the substrate, and an upper select gate on top. A plurality of horizontal word lines is formed using planar word line layers that intersect with the columns, forming a so-called gate all around the cell at each layer.

In yet another structure, a vertical, thin-channel memory is described U.S. Pat. No. 9,698,156, entitled Vertical Thin-Channel Memory, by Lue, issued Jul. 4, 2017 (MXIC 2147-1A), which can be configured as a 3D NAND flash memory. In some embodiments, the memory can be configured for independent double gate operation, establishing two memory sites per frustum of a vertical channel structure.

U.S. Pat. No. 9,524,980, entitled U-Shaped Vertical Thin-Channel Memory, by Lue, issued Dec. 20, 2016 (MXIC 2147-1B), describes another high-density 3D memory array, based on vertical channel structures, where the NAND strings have a U-shaped configuration with memory cells disposed in series down one side, and up the other side, of a vertical channel structure.

A problem can arise in high-density memory based on vertical channel structures because of difficulty in the manufacturing and difficulty in biasing to achieve well controlled device parameters along the vertical channel structure, particularly near the lower layers of the structure.

For example, a string select gates on the opposing ends of a NAND string are used to connect selected NAND strings to bit lines and a common source line during operation. In some NAND structures, the select gate transistors are implemented using memory cell technology which can trap charge during manufacture for example that raises the threshold in the select gate transistors. For these structures, a "threshold relocating" process is executed to lower the threshold in the select gate transistors so that they are operable during memory operations with relatively low gate voltages. In 3D NAND structures, the select gate transistors at the bottom of the vertical channel structures can be difficult to control. This can be true even if the select gate transistors do not have a charge trapping, gate dielectric.

For example, in some cases the bottom select gate transistors may have a threshold below 0 V. The "threshold relocating" process requires applying program bias arrangements to program the select gate transistors including the top select gate transistors. The low threshold bottom select gate transistors may interfere with these biasing arrangements, and prevent successful threshold relocating.

Other reliability problems may occur as well because of difficulty in process control at the bottom of a deep trench or hole, as necessary in the forming of a bottom select gate transistor for a vertical NAND string. When the top and bottom select gate transistors do not have well-controlled threshold voltages, or other well-controlled characteristics, current leakage from the strings can cause read operations to fail, or other problems.

It is desirable therefore to provide a vertical NAND string structure that can address one or more of these problems.

SUMMARY

Technology is described that utilizes plural lower select gates in lower levels of vertical NAND structures, and applies different routing arrangements to address process challenges, including challenges presented by manufacturing and operating high density NAND. The technology provides flexibility to improve bottom layer controllability, and to achieve higher yield.

A 3D NAND memory on a single integrated circuit based on technology described herein, includes a block of vertical NAND strings, the block of vertical strings including a plurality of sub-blocks. Sub-blocks in the plurality of sub-blocks each include a plurality of NAND strings comprising an upper select line in an upper level; word lines in intermediate levels below the upper level; a first lower select line in a first lower level below the intermediate levels; a second lower select line in a second lower level below the first lower level. A reference conductor can be disposed below the block in electrical contact with a plurality of vertical NAND strings in the block. A plurality of bit lines are disposed over the block in electrical contact with corresponding NAND strings in the block. Also, control circuitry on the device is configured to apply voltages to the upper select lines, to the word lines and to the first and second lower select lines in the plurality of sub-blocks.

An implementation of devices based on technology described herein can comprise a memory including a block of vertical channel structures disposed in a plurality of levels of conductive strips, such as 3D NAND memory device. The block of vertical channel structures can include a plurality of sub-blocks, where the sub-blocks comprise an upper select line (e.g. SSL) for vertical channel structures in the sub-block implemented by conductive strip in an upper level; word lines (e.g. WLs) for vertical channel structures in the sub-block implemented by conductive strips in intermediate levels below the upper level; a first lower select line (e.g. GSL1) for vertical channel structures in the sub-block, implemented using a conductive strip in a first lower level below the intermediate levels; and a second lower select line (e.g. GSL2) for vertical channel structures in the sub-block, implemented using a conductive strip in a second lower level below the first lower level. Control circuitry on the device is configured to apply voltages to the upper select lines, to the word lines and to the first and second lower select lines in the plurality of sub-blocks that implement various bias arrangements for memory operations, including for a flash NAND memory read, program and erase operations.

The device can include a reference conductor below the block of vertical channel structures in electrical contact with a plurality of vertical channel structures in the block; and a plurality of bit lines over the block of vertical channel structures in electrical contact with corresponding vertical channel structures in the plurality of vertical channel structures.

Routing of the signals for the conductive strips can comprise conductors in a variety of configurations. In an example described herein the device includes one or more patterned conductor layers (e.g. metal layers) overlying the block. The routing in first and second sub-blocks in the plurality of sub-blocks can be configured such that the first lower select line includes an interlayer conductor in a via connecting the conductive strip of the first lower select line to a first lower select line conductor in the one or more patterned conductor layers, where the first lower select line can be individually operated for each sub-block in the block. Also the routing can be configured so that the second lower select line includes an interlayer conductor in a via connecting the conductive strip of the second lower select line to a second lower select line conductor in the one or more patterned conductor layers, where the second lower select line conductor is connected to the interlayer conductor of the second lower select line in both of the first and second sub-blocks, so that the second lower select lines in plural sub-blocks in a given block are controlled by a shared signal.

In other embodiments, multiple upper select gates are utilized. In other embodiments, more than two lower select gates are utilized.

Other aspects and advantages of the present invention can be seen on review of the drawings, the detailed description and the claims, which follow.

BRIEF DESCRIPTION OF THE DRAWINGS

FIGS. 1A and 1B are a cross-section view and a circuit schematic respectively of a vertical NAND string as described herein.

FIG. 8 is a layout view for an alternative embodiment of signal routing for a block of vertical channel structures having a cross-section like that of FIG. 7B.

FIGS. 9A and 9B are layout and cross-section views respectively, illustrating an embodiment of signal routing for a block of vertical channel structures as described herein with more than two upper select gate transistors.

FIGS. 10A and 10B are layout and cross-section views respectively, illustrating an embodiment of signal routing for a block of vertical channel structures as described herein with more than two upper select gate transistors.

DETAILED DESCRIPTION

Figure 2:
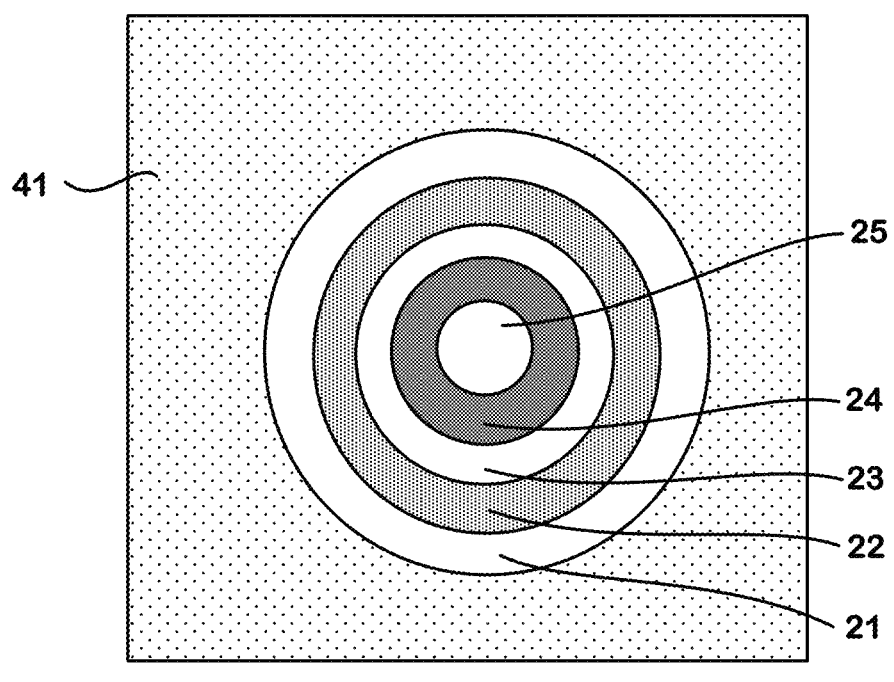
FIG. 2 illustrates a gate-all-around flash cell, such as can be implemented by a structure shown in FIG. 1A.

A detailed description of embodiments of the present invention is provided with reference to the FIGS. 1A-13.

FIG. 1A illustrates a vertical channel structure (generally 10) for a vertical NAND string including plural lower select lines as described herein. A circuit schematic diagram of a vertical NAND string like that of FIG. 1A, is illustrated in FIG. 1B.

The vertical channel structure 20 is disposed in a hole or trench that penetrates a plurality of levels, where each level includes a corresponding conductive strip (26) including strips configured as select lines or word lines, separated from other conductive strips by insulating material. The conductive strips can comprise polysilicon, tungsten, or other conductive semiconductor or metal or metal alloy, a metal compound, or combinations of conductive materials, as suits a particular embodiment. The insulating material is not represented to avoid crowding in the figure. The depth of the hole or trench in which the vertical channel structure 20 is implemented can be significant, such that there may be 16, 32, 64 or more levels in a given implementation.

The vertical channel structure 20 includes an upper terminal 48 electrically connected to a bit line (not shown). Also, the vertical channel structure 20 includes a lower terminal 49 electrically connected to a reference line, such as a common source line (not shown).

The vertical channel structure comprises multiple layers, including a data storage layer and a channel layer, which line the side walls conductive strips within the hole or trench, forming memory cells at cross points of conductive strips used as word lines with the vertical channel structure.

The data storage layer in this example comprises a blocking dielectric layer 21, a dielectric charge trapping layer 22, and a tunneling dielectric layer 23. Other types of data storage layers can be utilized as well. The channel layer in this example comprises a polysilicon layer 24, or other semiconductor material. In this illustration, the vertical channel structure includes a gap or seam 25.

In this embodiment, the conductive strip 40 in an upper level (the uppermost level in this example) is configured to be part of an upper select line, referred for the purposes of this example as a string select line SSL, for the vertical channel structure, whereby an upper select gate transistor is formed at the frustum in the crosspoint of the conductive strip 40 and the vertical channel structure. The conductive strip is configured to be part of a string select line by connection to electrical routing to a decoded driver circuit for controlling operation of the upper select gate. The gate dielectric for the upper select gate transistor in this example is formed by the data storage layer (21, 22, 23). During manufacturing or configuration of the NAND string, the data storage layer for the upper select gate transistor may be set to a low threshold state so that it acts as a switch for connecting the NAND string to the corresponding bit line. In alternative embodiments, the gate dielectric can be implemented using a single layer of oxide for example or other gate dielectric material that does not tend to store charge.

Conductive strips (41, 42, 43, 44) in the intermediate levels are configured to be part of word lines. These conductive strips are configured to be part of word lines by connection to electrical routing to word line drivers. Memory cells are disposed by the structure at the frustums of the vertical channel structure 20 at cross points with the conductive strips (41-44) configured to be part of word lines.

A cross-section of the memory cells in an embodiment in which the vertical channel structures are formed in a hole is illustrated in FIG. 2. In this example, the conductive strip, such as strip 41, is penetrated by a hole in the Z dimension in which the vertical channel structure is disposed. The vertical channel structure includes the data storage structure having a blocking dielectric layer 21, a charge storage layer 22, and a tunneling layer 23. Polysilicon channel layer 24 is disposed on the inside of the structure.

Referring to FIG. 1A, conductive strip 45 in a first lower level, below the intermediate levels used as word lines, is configured to be part of a first lower select line, referred to for the purposes of this example as a first ground select line GSL1, for the vertical channel structure, whereby a first lower select gate transistor is formed at the frustum in the crosspoint of the conductive strip 45 and the vertical channel structure. The conductive strip 45 is configured to be part of a first ground select line for a sub-block by connection to electrical routing to a decoded driver circuit for controlling operation of the first lower select gate. The gate dielectric for the first lower select gate transistor in this example is formed by the data storage layer (21, 22, 23). During manufacturing or configuration of the NAND string, the data storage layer for the first lower select gate transistor may be set to a low threshold state so that it acts as a switch for connecting the NAND string to the corresponding reference line. In alternative embodiments, the gate dielectric can be implemented using a single layer of oxide for example or other gate dielectric material that does not tend to store charge.

A conductive strip 46 in a second lower level below the first lower level, is configured to be part of a second lower select line, referred to for the purposes of this example as a second ground select line GSL2, for the vertical channel structure, whereby a second lower select gate transistor is formed at the frustum in the crosspoint of the conductive strip 46 and the vertical channel structure. The conductive strip 46 is configured to be part of a second ground select line for a sub-block or for a block by connection to electrical routing to a decoded driver circuit for controlling operation of the second lower select gate. The gate dielectric for the second lower select gate transistor in this example is formed by an insulator as illustrated between a conductive plug 49 at the bottom of the vertical channel structure, or by the data storage layer in some cases. The second lower select gate transistor acts as a switch for connecting the NAND string to the corresponding reference line.

Control circuitry (not shown) including drivers for the upper select line and the first and second lower select lines is included on an integrated circuit, which includes an array of NAND strings, including the vertical channel structure 20.

This memory cell structure of FIG. 2 is referred to as a gate-all-around cell, such as a pipe-shaped BiCS flash cell, described in the Katsumata et al. publication, at the level of a word line. In other embodiments, the vertical channel structures disposed in a trench, so that there can be two memory cells at each word line frustum. See, for example, U.S. Pat. No. 9,698,156, entitled VERTICAL THIN-CHANNEL MEMORY, by Lue, issued Jul. 4, 2017, which is incorporated by reference as if fully set forth herein.

FIG. 1B shows a circuit schematic of the vertical NAND structure of FIG. 1A representing the transistors and memory cells formed at the frustums of the vertical channel structure at the crosspoints with the conductive strips. The vertical NAND structure includes an upper select gate 50, a plurality of memory cells 51-54, a first lower select gate 55 and a second lower select gate 56 connected in series between a bit line BL and a common source line CSL.

Figure 3:
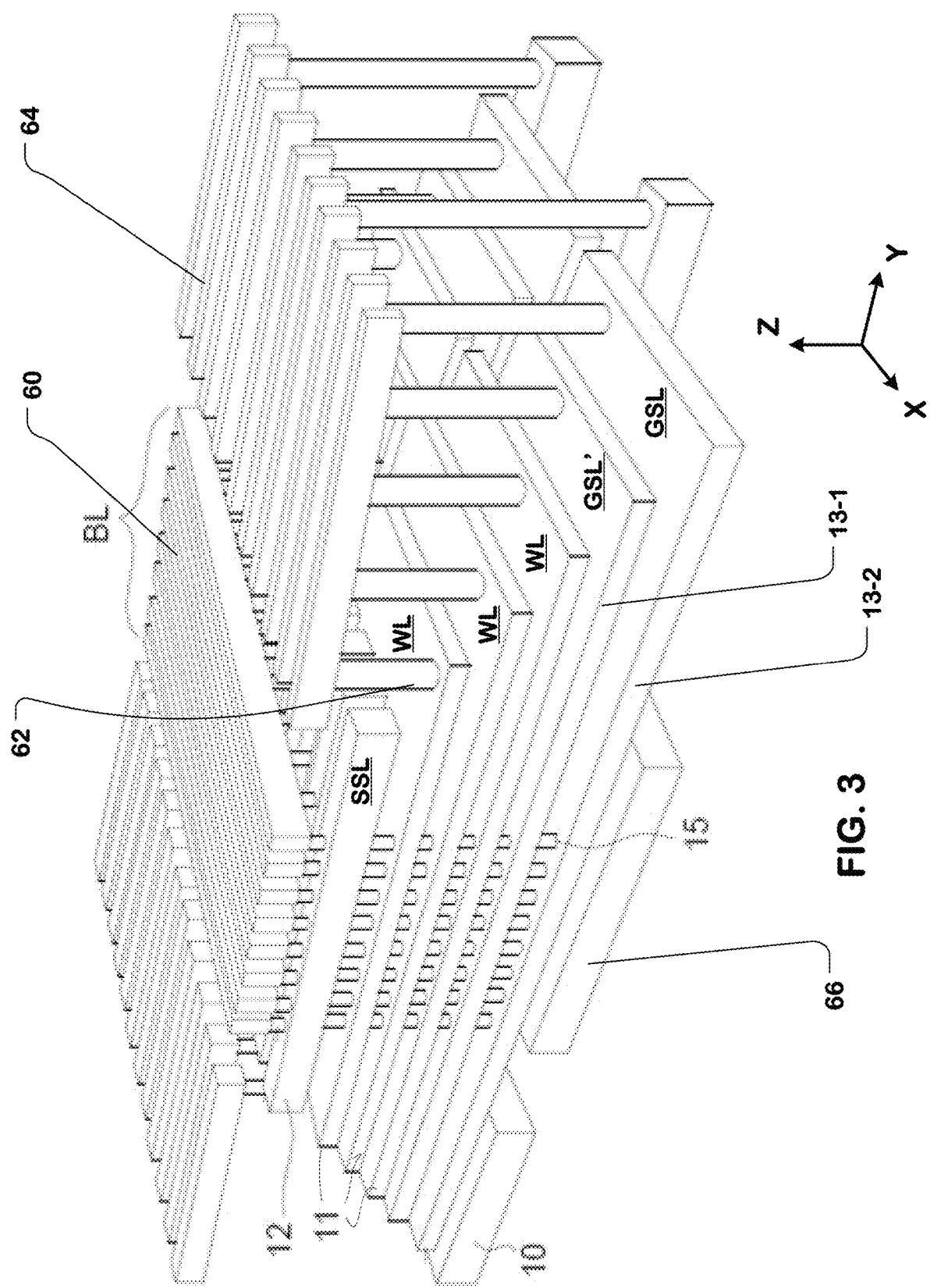
FIG. 3 is a simplified perspective of a block of a 3D NAND device including a plurality of vertical channel structures, and plural lower select lines.

FIG. 3 is a perspective view of a 3D semiconductor device having a plurality of lower select lines, like those described with reference to FIGS. 1A and 1B. It comprises a multilevel stack of word line conductive strips 11, each parallel to the substrate 10; a plurality of pillars 15 oriented orthogonally to the substrate, each of the pillars comprising a vertical channel structure, which can be implemented as discussed above, forming plurality of series-connected memory cells located at cross-points between the pillars and the conductive strips; and a plurality of string select lines (SSLs) 12 are disposed in a upper select line conductive strip in an upper level oriented parallel to the substrate and above the conductive strips 11 in intermediate levels configured as word lines, each of the string select lines intersecting a respective row of the pillars. Each intersection of a pillar and a string select line defines an upper select gate of the pillar.

The 3D semiconductor device of FIG. 3 also includes a first lower select line GSL' disposed in a first lower select line conductive strip 13-1, in a lower level below the conductive strips in the intermediate levels configured as word lines, and a second lower select line GSL disposed in a second lower select line conductive strip 13-2, which is below the first lower select line conductive strip 13-1.

The structure also includes one or more patterned conductor layers (e.g. patterned metal layers) that include a plurality of parallel bit line conductors (e.g. 60) in a layer parallel to the substrate and above the string select lines and a plurality of conductors (e.g. 64) that are connected by interlayer conductors through vias to landing areas on the word line conductive strips, the upper select line conductive strips, and the lower select line conductive strips. The vertical channel structures of the pillars (e.g. pillar 15) are electrically connected to corresponding bit line conductors in the plurality of bit lines through the upper select gate on the pillar, which controls current flow through the vertical channel structure to the bit line. Each of the bit line conductors superposes a respective column of the pillars, and each of the pillars underlies one of the bit line conductors. Other configurations of the 3D gate-all-around NAND structures can be use as well. See for example, U.S. Pat. No. 9,373,632, by Chen, entitled TWISTED ARRAY DESIGN FOR HIGH SPEED VERTICAL CHANNEL 3D NAND MEMORY, issued Jun. 21, 2016, which is incorporated by reference in its entirety, as if fully set forth herein.

A common source line structure 66 (e.g. a conductive region in the substrate coupled to a reference voltage source) is disposed below the array of pillars, and electrically connected to the vertical channel structures in the pillars through the first and second lower select gates on the pillars, which in combination control current flow through the vertical channel structure to the common source line structure.

The conductive strips in the plurality of levels of the structure extend into a staircase contact region, where each comprises a landing area connected to an interlayer conductor in a via connecting the conductive strip to a corresponding conductor in one or more patterned conductor layers that are over the array (illustrated heuristically in the figure). Thus, the first lower select line includes a patterned conductor layer 13-1 connected by an interlayer conductor to a first lower select line conductor in the one or more patterned conductor layers. Likewise the second lower select line includes a patterned conductor layer 13-2, connected by an interlayer conductor to a second lower select line conductor in the one or more patterned conductor layers. In a similar manner, the upper select line includes a patterned conductor layer connected by an interlayer conductor (e.g. 62) through a via to an upper select line conductor in the one or more patterned conductor layers.

The 3D semiconductor device of FIG. 3 comprises a plurality of blocks of vertical channel structures, each of which comprises a plurality of sub-blocks. A sub-block for the purposes of this description comprises a plurality of vertical channel structures connected in common to a single upper select line. A block comprises a set of sub-blocks arranged so that at least one vertical channel structure in each sub-block is electrically connected to each of the bit lines operatively coupled with the block, so only one vertical channel structure can be selected for the bit line by providing a select signal to a selected one of the upper select lines on the vertical channel structures.

Figure 4:
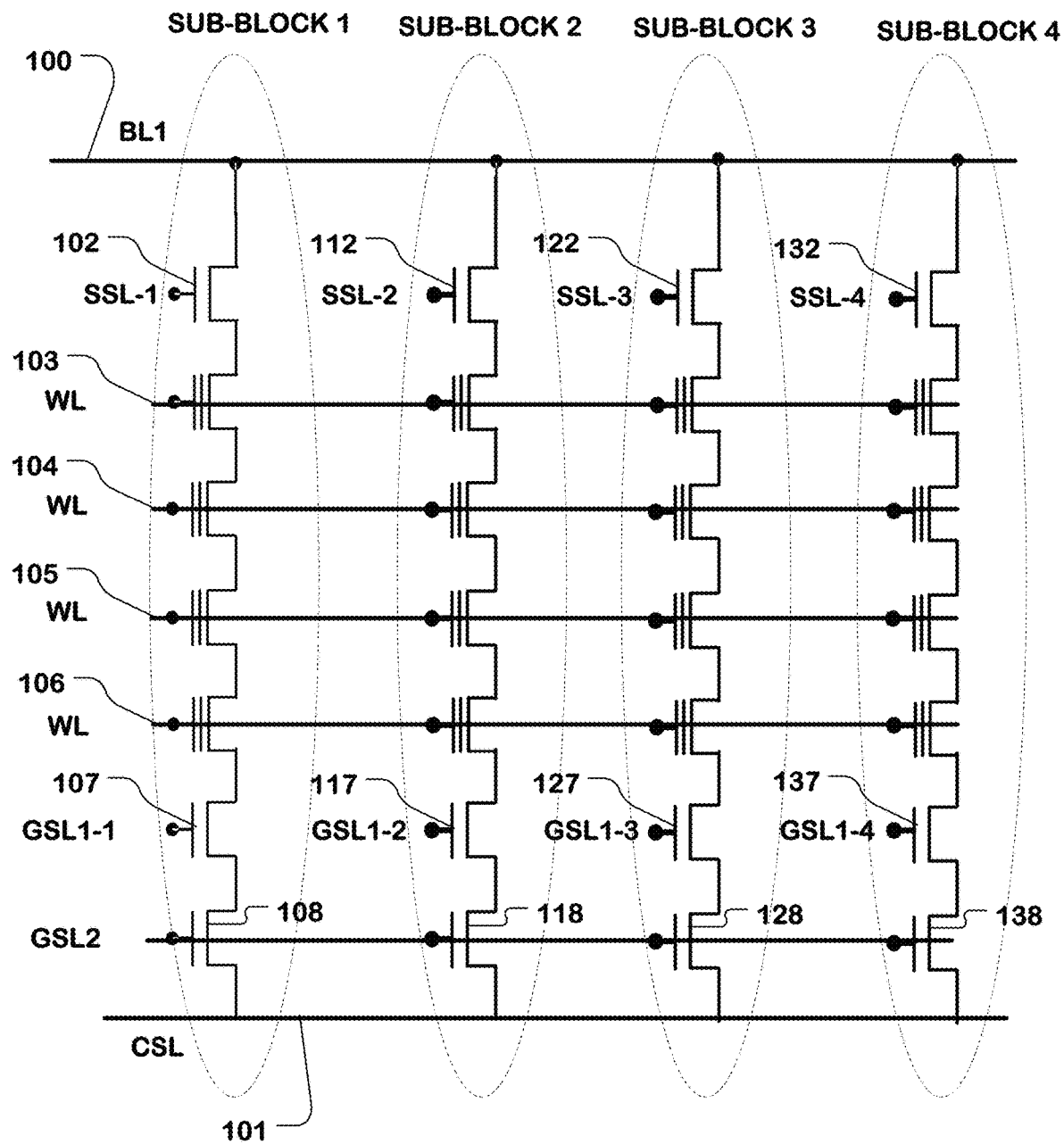
FIG. 4 is a circuit schematic of part of a 3D NAND device as described herein.

FIG. 4 is a circuit schematic showing four NAND strings from a portion of one slice of a block of vertical channel structures, taken along a bit line direction. Each of the NAND strings has a structure such as described above with reference to FIG. 1A, having a plurality of lower select gates in each NAND string. Although only four memory cells are shown in the NAND strings in FIG. 4, any the number of cells can be included in the NAND string as discussed above.

A block of the memory is coupled with a plurality of bit lines. The slice represented by the circuit schematic in FIG. 4 shows the connection of four NAND strings between one bit line 100 in the block and a common source line 101, although there may be more than one common source line coupled with a given block.

Each of the four NAND strings is one of a plurality of NAND strings in the sub-block, where each sub block of NAND strings shares a single upper select line (e.g. SSL-1 for one of the sub-blocks). Each of the NAND strings has an upper select gate (102, 112, 122, 132) controlled by a corresponding upper select line SSL-1, SSL-2, SSL-3, SSL-4 for its respective sub-block, that is also connected to upper select gates in the other NAND strings (not shown) which are part of the same the sub-block.

In some embodiments, some or all of the NAND strings in the block may include more than one upper select gate, and more than one upper select line.

Each of the plurality of NAND strings has a set of series connected memory cells that are coupled to corresponding word lines 103, 104, 105, 106. Thus the word lines 103, 104, 105, 106 are shared among the NAND strings in the block.

Each of the four NAND strings as a first lower select gate 107, 117, 127, 137 controlled by an individual first lower select line GSL1-1, GSL1-2, GSL1-3, GSL1-4, for its respective sub-block. In some embodiments, the first lower select lines GSL1-1, GSL1-2, GSL1-3, GSL1-4 can also be connected to the other NAND strings in the same sub-block.

Each of the four NAND strings has a second lower select gate 108, 118, 128, 138 controlled by a shared second lower select line GSL2 for the block, which is shared among the sub-blocks in this example.

In other examples, the second lower select gates 108, 118, 128, 138 may be controlled by individual second lower select lines. Also, in other embodiments, the first lower select gates 107, 117, 127, 137 may be controlled by a single shared first lower select line.

In yet other embodiments, there may be more than two lower select gates in some or all of the NAND strings in the block.

Figure 5A:
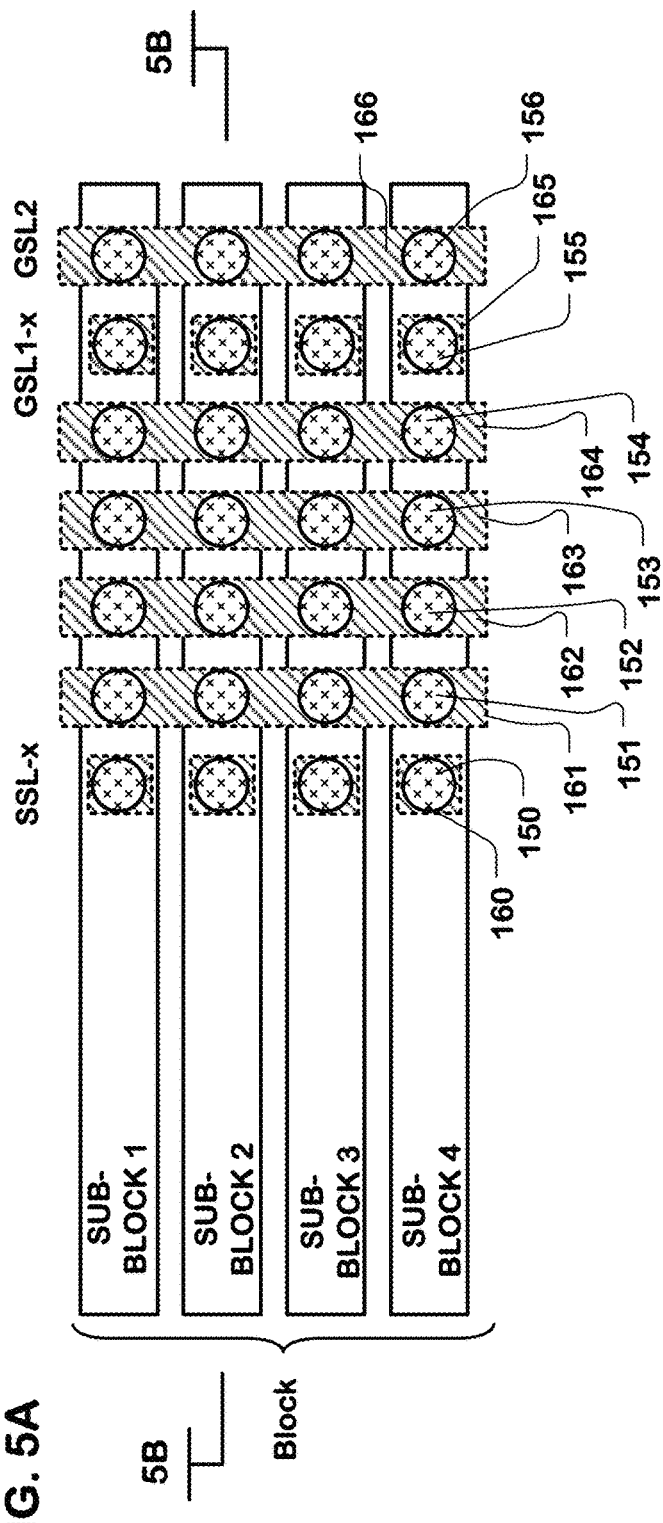
FIGS. 5A and 5B are layout and cross-section views respectively, illustrating an embodiment of signal routing for a block of vertical channel structures as described herein.
Figure 5B:
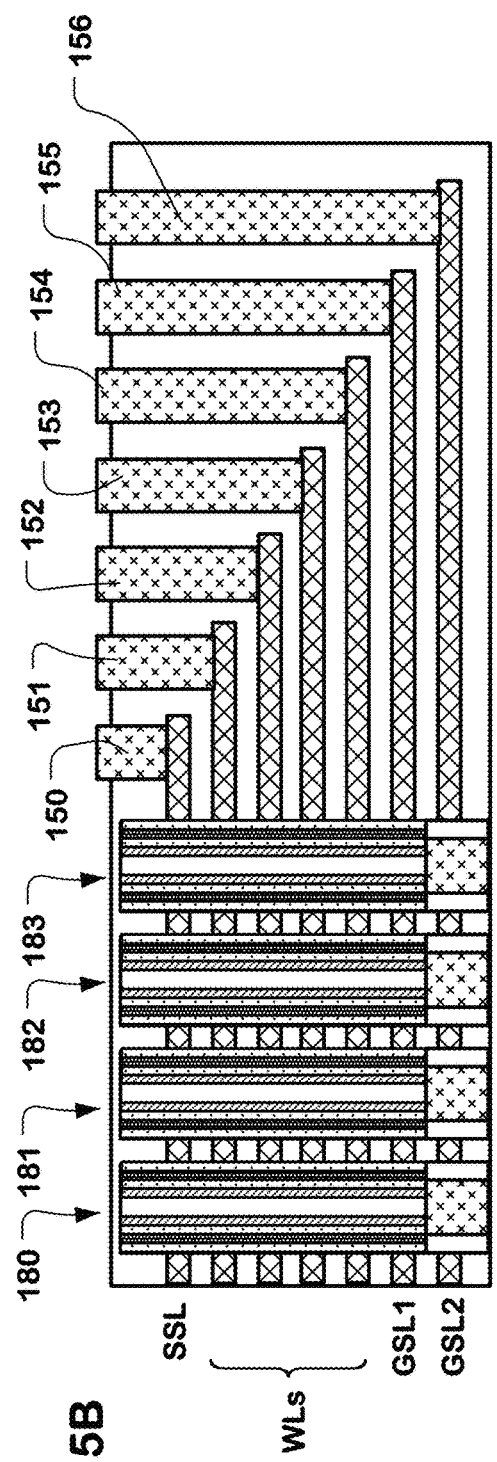

FIG. 5A and FIG. 5B illustrate signal routing in a block of vertical NAND strings that can implement a circuit schematic like that of FIG. 4. In FIG. 5A a block of vertical channel structures for NAND strings is represented, which includes four sub-blocks (SUB-BLOCK 1, SUB-BLOCK 2, SUB-BLOCK 3, SUB-BLOCK 4). Although not illustrated, each of the sub-blocks comprises an array of vertical NAND structures, in which all the vertical NAND structures in the array of the sub-block share an upper select line SSL-x (where -x represents the sub-block number).

FIG. 5B is a cross-section of the along line 5B-5B in FIG. 5A. Thus it shows a cross-section orthogonal to the bit line direction of SUB-BLOCK 2. Each of the sub-blocks illustrated in FIG. 5A can have the same cross-section.

The sub-block includes a plurality of conductive strips in respective levels of the 3D structure. An upper conductive strip in an upper level of the stack is configured to be part of a SSL line. Intermediate conductive strips in intermediate levels of the stack are configured to be part of word lines WLs. A first lower conductive strip in a lower level below the intermediate levels is configured to be part of a first lower select line GSL1. A second lower conductive strip in a level lower than the first lower conductive strip is configured to be part of a second lower select line GSL2.

A plurality of vertical channel structures 180, 181, 182, 183 which can have a structure like that shown in FIG. 1A are disposed in holes through the stack of conductive strips in each sub-block. Also, each of the conductive strips extends horizontally into a stairstep contact region where landing areas on each conductive strip are connected to vertical interlayer conductors through vias to one or more patterned conductor layers (not shown in FIG. 5B) overlying the sub block. Portions of the patterned conductor layers are illustrated in FIG. 5A.

Referring to FIG. 5B, an inter-layer conductor 150 contacts a landing area on the conductive strip configured as the SSL line. Interlayer conductors 151, 152, 153, 154 contact landing areas on the conductive strips configured as word lines. Interlayer conductors 155 and 156 contact landing areas on the lower conductive strips configured as the first lower select line GSL1 and the second lower select line GSL2.

FIG. 5A shows a layout view over the block showing connections of the interlayer conductors (e.g. 150-156) to patterned conductors in a first patterned conductor layer over the stairstep contact region of the block.

In this embodiment, the interlayer connectors on each of the SSL lines is connected to a separate patterned conductor line (e.g. 160) so that each of the sub-blocks can be individually controlled by the SSL line. The interlayer connectors (e.g. 151-154) on each of the word lines is connected in common to a shared patterned conductor line (e.g. 161-164) so that the vertical NAND structures in multiple sub-blocks can share the word lines.

In this embodiment, the interlayer connectors (e.g. 155) on each of the first lower select lines GSL1-x is connected to a separate patterned conductor line GSL1-x (e.g. 165) so that each of the sub-blocks can be individually controlled by the GSL1-x line.

In this embodiment, the interlayer connectors (e.g. 156) on each of the second lower select lines GSL2 is connected to a shared patterned conductor line (e.g. 166) so that the vertical NAND structures and multiple sub-blocks can share the GSL2 line.

The first lower select line GSL1, and the corresponding first lower select gate transistor, are disposed in a region of the structure that is more easily controlled during manufacture and during threshold relocating processes, than the lower second lower select line. In this embodiment, it is also a charge trapping cell, and can be programmed to a selected threshold level so that it can be effectively turned off at zero voltage, or other desired operating voltage specification. In this manner, string leakage problems can be overcome. The configuration including plural lower select gate transistors facilitates this programming operation, by enabling more flexible biasing arrangements that can isolate selected vertical channel structures while limiting leakage current.

As mentioned above, only one patterned conductor layer is illustrated in FIG. 5A. In a particular embodiment there may be for example, three patterned conductor layers, or more, which are used to route the SSL, word lines and GSL1 and GSL2 to control circuitry that includes decoders and drivers for operation of the device.

Figure 6:
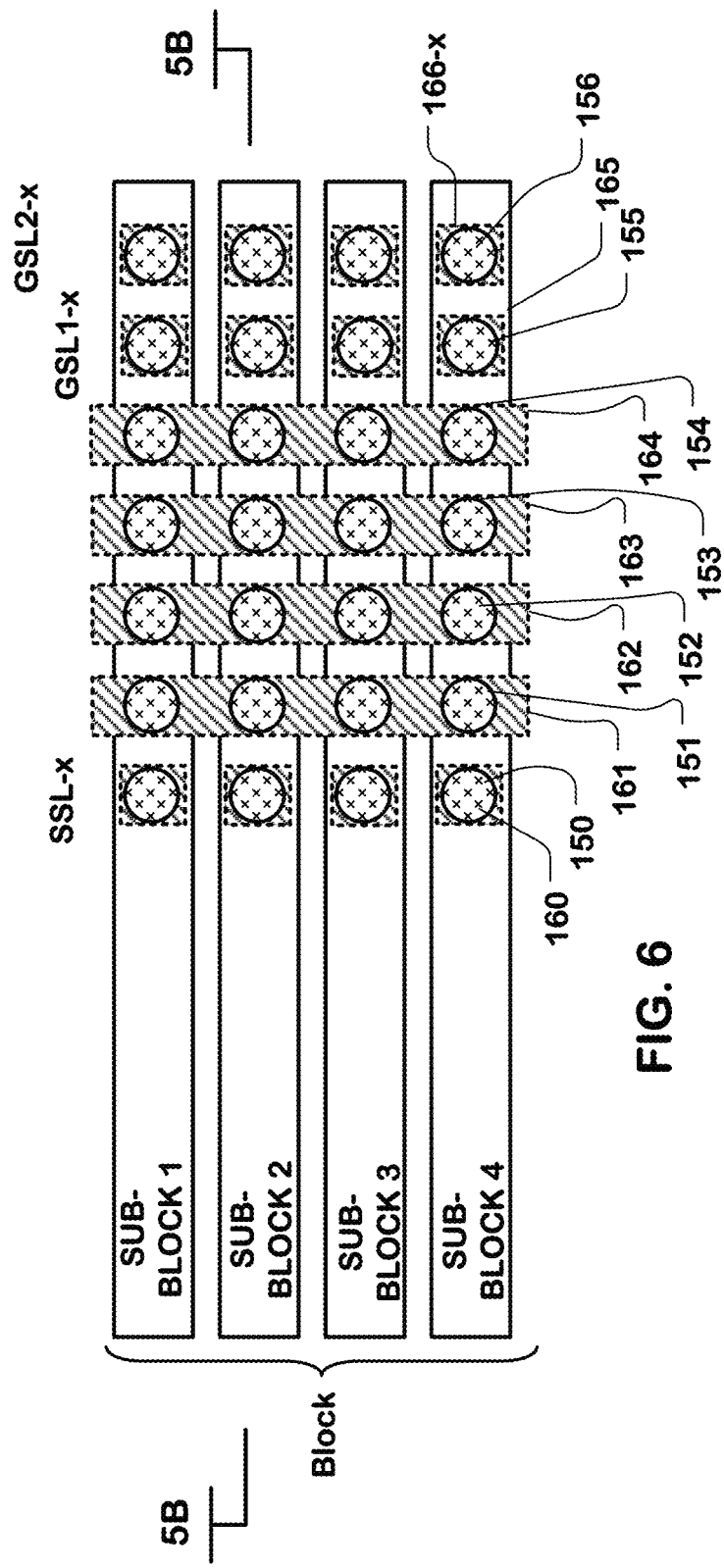
FIG. 6 is a layout view for an alternative embodiment of signal routing for a block of vertical channel structures having a cross-section like that of FIG. 5B.

FIG. 6 illustrates an alternative routing for the SSL, word lines and GSL1 and GSL2 in the overlying first patterned conductor layer, corresponding to that of FIG. 5A. FIG. 5B still represents a cross-section along a line 5B-5B through the SUB-BLOCK 2 of the embodiment of FIG. 6. The same reference numerals are utilized where appropriate in FIG. 6 as are used in FIG. 5A.

The embodiment of FIG. 6 differs from that of FIG. 5A because the interlayer connectors (e.g. 156) on each of the second lower select lines GSL2-x is connected to a separate patterned conductor line GSL2-x (e.g. 166-x) so that each of the sub-blocks can be individually controlled by the GSL2-x lines.

Figures 7A, 7B:
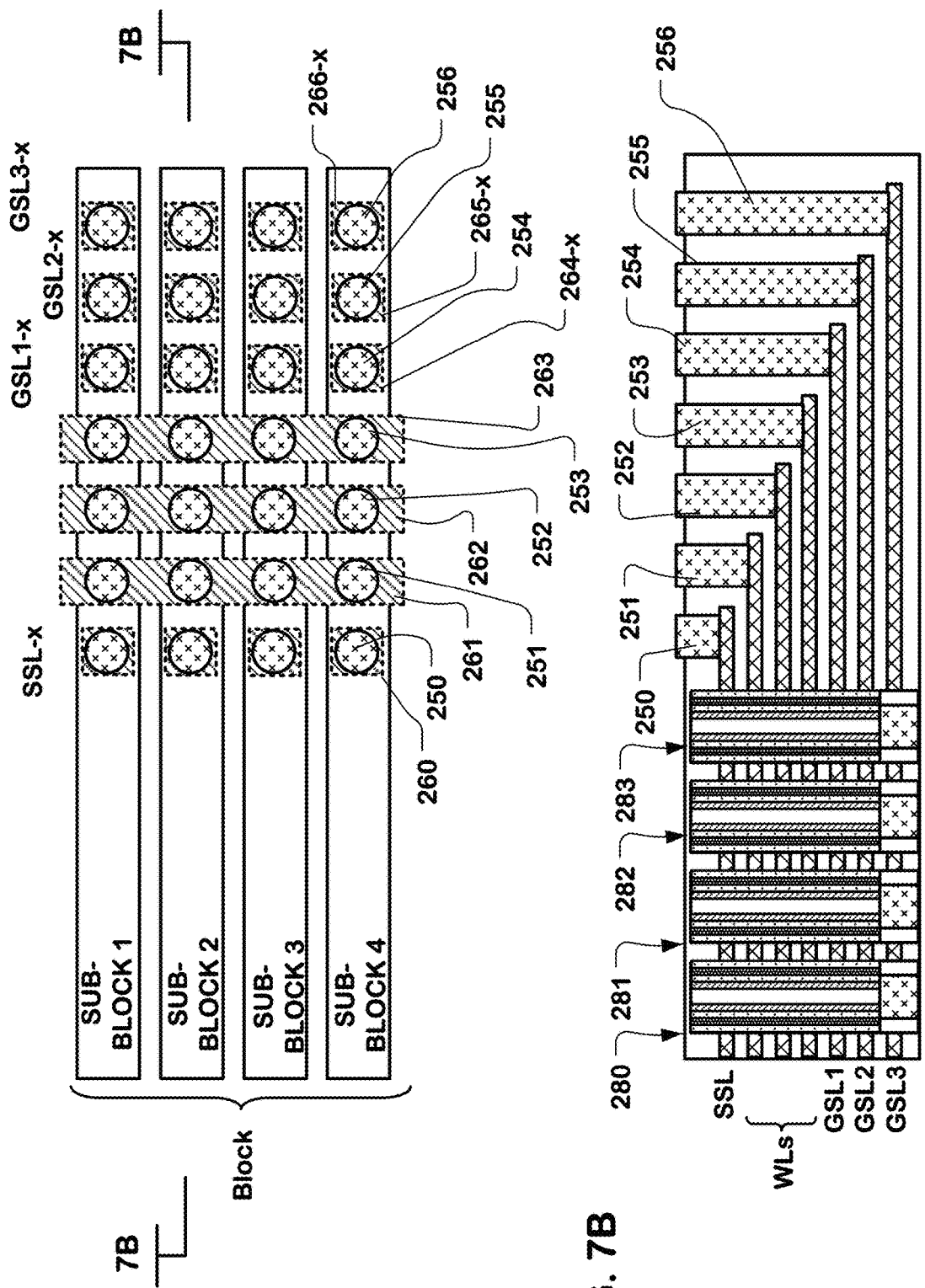
FIGS. 7A and 7B are layout and cross-section views respectively, illustrating an embodiment of signal routing for a block of vertical channel structures as described herein with more than two lower select gate transistors.

In FIG. 7A, a block of vertical channel structures for NAND strings is represented, which includes four sub-blocks (SUB-BLOCK 1, SUB-BLOCK 2, SUB-BLOCK 3, SUB-BLOCK 4), with a third lower select line GSL3. Although not illustrated, each of the sub-blocks comprises an array of vertical NAND structures, in which all the vertical NAND structures in the array of the sub-block share an upper select line SSL-x.

FIG. 7B is a cross-section of the along line 7B-7B in FIG. 7A. Thus it shows a cross-section orthogonal to the bit line direction of SUB-BLOCK 2. Each of the sub-blocks illustrated in FIG. 7A can have the same cross-section.

The sub-block includes a plurality of conductive strips and respective levels of the 3D structure. An upper conductive strip in an upper level of the stack is configured to be part of a SSL line. Intermediate conductive strips in intermediate levels of the stack are configured to be part of word lines WLs. A first lower conductive strip in a lower level below the intermediate levels is configured to be part of a first lower select line GSL1. A second lower conductive strip in a level lower than the first lower conductive strip is configured to be part of a second lower select line GSL2. A third lower conductive strip in a level lower than the second lower conductive strip is configured to be part of a third lower select line GSL3.

A plurality of vertical channel structures 280, 281, 282, 283 which can have a structure like that shown in FIG. 1A are disposed in holes through the stack of conductive strips in each sub-block. Also, each of the conductive strips extends horizontally into a stairstep contact region where line being areas on each conductive strip are connected to vertical interlayer conductors through vias to patterned conductor layers (not shown in FIG. 7B) overlying the sub-block. Portions of the patterned conductor layers are illustrated in FIG. 7A.

Referring to FIG. 7B, an interlayer conductor 250 contacts a landing area on the conductive strip configured as the SSL line. Interlayer conductors 251, 252, 253 contact landing areas on conductive strips configured as word lines. Interlayer conductors 254, 255, 256 contact landing areas on the lower conductive strips configured as the first lower select line GLS1, the second lower select line GSL2 and the third lower select line GSL3.

FIG. 7A shows a layout view over the block showing connections of the interlayer conductors (e.g. 250-256) to patterned conductors in a first patterned conductor layer over the stairstep contact region of the block.

In this embodiment, the interlayer connectors on each of the SSL lines is connected to a separate patterned conductor line (e.g. 260) so that each of the sub-blocks can be individually controlled by the SSL line. The interlayer connectors (e.g. 251-253) on each of the word lines is connected in common to a shared patterned conductor line (e.g. 261-263) so that the vertical NAND structures in multiple sub-blocks can share the word lines.

In this embodiment, the interlayer connectors (e.g. 254, 255, 256) on each of the first lower select lines GSL1-x, second lower select lines GSL2-x and third lower select lines GSL3-x is connected to a corresponding separate patterned conductor line GSL1-x (e.g. 165), GSL2-x (e.g. 265-x), GSL3-x (e.g. 266-X) so that each of the sub-blocks can be individually controlled by each of the GSL1-x, GSL2-x and GSL3-x lines.

As mentioned above, only one patterned conductor layer is illustrated in FIG. 7A. In a particular embodiment there may be more patterned conductor layers which are used to route the SSL, word lines and GSL1, GLS2 and GSL3 to control circuitry that includes decoders and drivers for operation of the device.

FIG. 8 illustrates an alternative routing for the SSL, word lines and GSL1 and GSL2 in the overlying first patterned conductor layer, corresponding to that of FIG. 7A. FIG. 7B still represents a cross-section along a line 7B-7B through the SUB-BLOCK 2 of the embodiment of FIG. 8. The same reference numerals are utilized where appropriate in FIG. 8 as are used in FIG. 7A.

The embodiment of FIG. 8 differs from that of FIG. 7A because the interlayer connectors (e.g. 256) on the third lower select line GSL3 in each of the sub-blocks is connected to a shared patterned conductor line GSL3 (e.g. 266) so that each of the sub-blocks can be share the GSL3 line.

In FIG. 9A, a block of vertical channel structures for NAND strings is represented, which includes four sub-blocks (SUB-BLOCK 1, SUB-BLOCK 2, SUB-BLOCK 3, SUB-BLOCK 4), with second upper select line SSL2 that is connected in common with the first upper select line SSL1 in the patterned metal layer. Although not illustrated, each of the sub-blocks comprises an array of vertical NAND structures, in which all the vertical NAND structures in the array of the sub-block share the first upper select line SSL1-*x* and the second upper select line SSL-2.

FIG. 9B is a cross-section of the along line 9B-9B in FIG. 9A. Thus it shows a cross-section orthogonal to the bit line direction of SUB-BLOCK 2. Each of the sub-blocks illustrated in FIG. 9A can have the same cross-section.

The sub-block includes a plurality of conductive strips and respective levels of the 3D structure. An upper conductive strip in an upper level of the stack is configured to be part of a first SSL1 line. A second upper conductive strip in an upper level of the stack is configured to be part of a second SSL2 line. Intermediate conductive strips in intermediate levels of the stack are configured to be part of word lines WLs. A first lower conductive strip in a lower level below the intermediate levels is configured to be part of a first lower select line GSL1. A second lower conductive strip in a level lower than the first lower conductive strip is configured to be part of a second lower select line GSL2.

A plurality of vertical channel structures 380, 381, 382, 383 which can have a structure like that shown in FIG. 1A are disposed in holes through the stack of conductive strips in each sub-block. Also, each of the conductive strips extends horizontally into a stairstep contact region where line being areas on each conductive strip are connected to vertical interlayer conductors through vias to patterned conductor layers (not shown in FIG. 9B) overlying the sub-block. Portions of the patterned conductor layers are illustrated in FIG. 9A.

Referring to FIG. 9B, an interlayer conductor 350 contacts a landing area on the conductive strip configured as the SSL1 line. Interlayer conductor 351 contacts a landing area on the conductive strip configured as the SSL2 line. Interlayer conductors 352, 353, 354 contact landing areas on conductive strips configured as word lines. Interlayer conductors 355, 356 contact landing areas on the lower conductive strips configured as the first lower select line GLS1 and the second lower select line GSL2.

FIG. 9A shows a layout view over the block showing connections of the interlayer conductors (e.g. 350-356) to patterned conductors in a first patterned conductor layer over the stairstep contact region of the block.

In this embodiment, the interlayer connectors on each of the SSL1 and SSL2 lines in each sub-block are connected in common to a single patterned conductor line (e.g. 360) so that each of the sub-blocks can be individually controlled by the SSL1 and SSL2 lines. The interlayer connectors (e.g. 352-354) on each of the word lines is connected in common to a shared patterned conductor line (e.g. 362-364) so that the vertical NAND structures in multiple sub-blocks can share the word lines.

In this embodiment, the interlayer connectors (e.g. 355) on each of the first lower select lines GSL1-*x* is connected to a separate patterned conductor line GSL1-*x* (e.g. 365-*x*) so that each of the sub-blocks can be individually controlled by the GSL1-*x* line.

In this embodiment, the interlayer connectors (e.g. 356) on each of the second lower select lines GSL2 is connected to a shared patterned conductor line (e.g. 366) so that the vertical NAND structures and multiple sub-blocks can share the GSL2 line.

As mentioned above, only one patterned conductor layer is illustrated in FIG. 9A. In a particular embodiment there may be more patterned conductor layers which are used to route the SSL/SSL2 line, word lines and GSL1 and GLS2 lines to control circuitry that includes decoders and drivers for operation of the device.

In FIG. 10A, a block of vertical channel structures for NAND strings is represented, which includes four sub-blocks (SUB-BLOCK 1, SUB-BLOCK 2, SUB-BLOCK 3, SUB-BLOCK 4), with second upper select line SSL2 and third upper select line SSL3 that are connected in common with the first upper select line SSL1 in the patterned metal layer. Although not illustrated, each of the sub-blocks comprises an array of vertical NAND structures, in which all the vertical NAND structures in the array of the sub-block share the first upper select line SSL1-*x*, the second upper select line SSL-2-*x*, and the third upper select line SSL3-*x*.

FIG. 10B is a cross-section of the along line 10B-10B in FIG. 10A. Thus it shows a cross-section orthogonal to the bit line direction of SUB-BLOCK 2. Each of the sub-blocks illustrated in FIG. 10A can have the same cross-section.

The sub-block includes a plurality of conductive strips and respective levels of the 3D structure. An upper conductive strip in an upper level of the stack is configured to be part of a first SSL1 line. A second upper conductive strip in an upper level of the stack is configured to be part of a second SSL2 line. A third upper conductive strip in an upper level of the stack is configured to be part of a third SSL3 line. Intermediate conductive strips in intermediate levels of the stack are configured to be part of word lines WLs. A first lower conductive strip in a lower level below the intermediate levels is configured to be part of a first lower select line GSL1. A second lower conductive strip in a level lower than the first lower conductive strip is configured to be part of a second lower select line GSL2.

A plurality of vertical channel structures 480, 481, 482, 483 which can have a structure like that shown in FIG. 1A are disposed in holes through the stack of conductive strips in each sub-block. Also, each of the conductive strips extends horizontally into a stairstep contact region where line being areas on each conductive strip are connected to vertical interlayer conductors through vias to patterned conductor layers (not shown in FIG. 10B) overlying the sub-block. Portions of the patterned conductor layers are illustrated in FIG. 10A.

Referring to FIG. 10B, an interlayer conductor 450 contacts a landing area on the conductive strip configured as the SSL1 line. Interlayer conductor 451 contacts a landing area on the conductive strip configured as the SSL2 line. Interlayer conductor 452 contacts a landing area on the conductive strip configured as the SSL3 line. Interlayer conductors 453, 454 contact landing areas on conductive strips configured as word lines. Interlayer conductors 455, 456 contact landing areas on the lower conductive strips configured as the first lower select line GLS1 and the second lower select line GSL2.

FIG. 10A shows a layout view over the block showing connections of the interlayer conductors (e.g. 450-456) to patterned conductors in a first patterned conductor layer over the stairstep contact region of the block.

In this embodiment, the interlayer connectors on each of the SSL1, SSL2 and SSL3 lines in each sub-block are connected in common to a single patterned conductor line (e.g. 460) so that each of the sub-blocks can be individually controlled by the SSL1 and SSL2 lines. The interlayer connectors (e.g. 453-454) on each of the word lines is connected in common to a shared patterned conductor line (e.g. 463-464) so that the vertical NAND structures in multiple sub-blocks can share the word lines.

In this embodiment, the interlayer connectors (e.g. 455) on each of the first lower select lines GSL1-x is connected to a separate patterned conductor line GSL1-x (e.g. 465-x) so that each of the sub-blocks can be individually controlled by the GSL1-x line.

In this embodiment, the interlayer connectors (e.g. 456) on each of the second lower select lines GSL2 is connected to a shared patterned conductor line (e.g. 466) so that the vertical NAND structures and multiple sub-blocks can share the GSL2 line.

As mentioned above, only one patterned conductor layer is illustrated in FIG. 10A. In a particular embodiment there may be three or more patterned conductor layers which are used to route the SSL/SSL2/SSL3 line, word lines and GSL1 and GLS2 lines to control circuitry that includes decoders and drivers for operation of the device.

A variety of examples of combinations that include one or more SSL lines and more than one GSL lines is described. These examples are representative of many combinations as will be appreciated by the reader.

Figure 11:
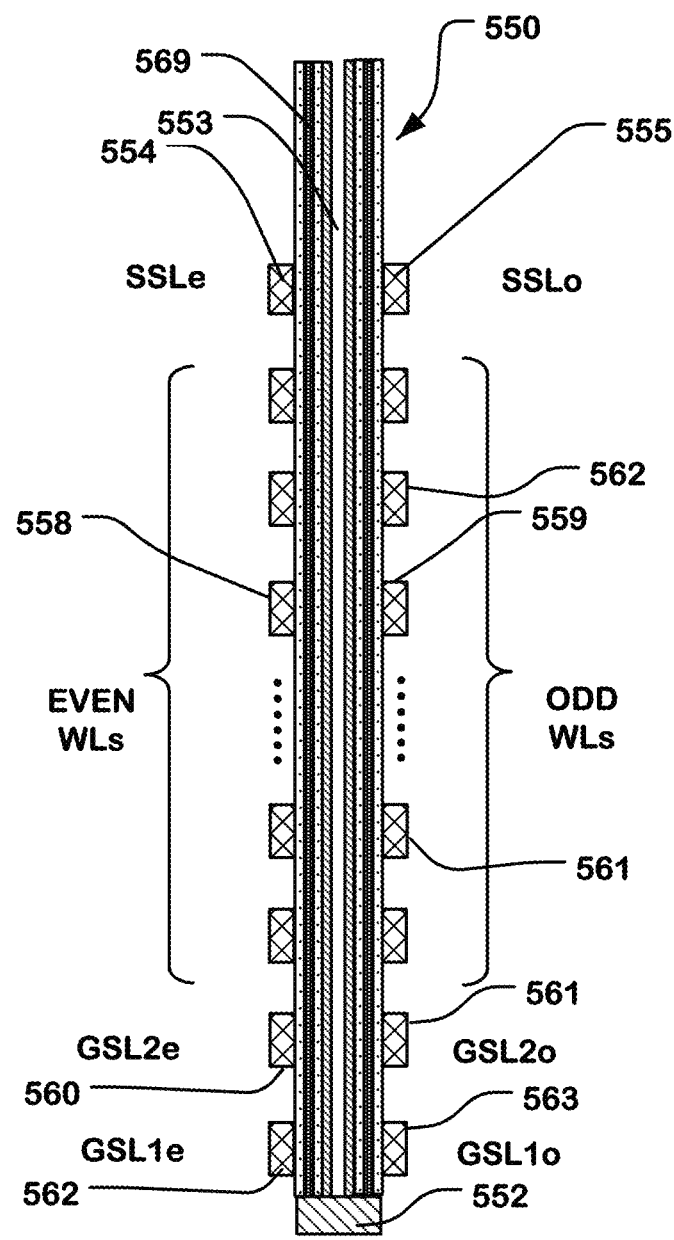
FIG. 11 is a heuristic cross-section of a vertical channel structure having even and odd vertical channel films in a 3D memory device, having plural lower select gates.

FIG. 11 is a cross-section of an alternative vertical channel structure 550, U.S. Pat. No. 9,698,156 entitled VERTICAL THIN-CHANNEL MEMORY, by Lue, issued Jul. 4, 2017, which is incorporated by reference in its entirety, as if fully set forth herein. The vertical channel structure 550 has memory cells on two sides, and showing conductive strips configured as even and odd string select lines SSLe, SSLo, even and odd first ground select lines GSL1e, GSL1o, even and odd second ground select lines GSL2e, GSL2o, even word lines and odd word lines. The vertical channel structure 550 in FIG. 11 includes a vertical polysilicon semiconductor body including even and odd vertical thin channel films separated by a seam 553, and a charge storage element 569 on each side of the semiconductor body, which can be continuous on the sidewalls of the stacks as shown, or separated into separate elements on the sidewalls of the conductive layers in the stacks which act as word lines.

The vertical channel structure 550 includes a portion providing a vertical channel body for string select line transistors adjacent the SSLe and SSLo conductive strips, and a portion which incorporates the reference conductor 552. Between the portions of the vertical channel structure which contact or incorporate the reference conductor 552, the seam 553 is disposed within the vertical channel structure 550 between the even and odd word lines. The seam 553 separates the two separate thin-channel film bodies at the frustum of the column (e.g. at the level of even word line 558 and odd word line 559) at which the word lines cross, in the regions of the conductive strips configured as word lines, providing thin channel films for the memory cells.

FIG. 11 illustrates conductive strips 554 and 555 configured as string select lines. The string select line conductive strips 554 and 555 can include a more highly conductive film on the outside surfaces, such as a film of a metal silicide.

FIG. 11 also illustrates conductive strips 560, 561 in a lower level below the intermediate levels, configured as even and odd first ground select lines GSL1e, GSL1o. The ground select lines 560, 561 can include more highly conductive films on the outside surfaces, such as a film of metal silicide.

Also, the structure includes conductive strips 562, 563 in a lower level configured as even and odd second ground select lines GSL2e, GSL2o. The ground select lines 560, 561 can include more highly conductive films on the outside surfaces, such as a film of metal silicide.

Likewise, conductive strip in intermediate levels are disposed as even and odd word lines on opposing sides of the vertical channel structure 550. Thus, an even word line 558 is disposed opposite an odd word line 559 in the structure. Eight word line layers are illustrated in this example. Of course a smaller or larger number of word line layers, such as 4, 16, 32, or more can be utilized. Also, in some embodiments, dummy word lines may be included, in addition those used for actual data storage.

In other embodiments, all or some of the string select lines, word lines and ground select lines are implemented using metal, or other conductive material, rather than polysilicon.

The structure illustrated in FIG. 11 comprises first and second NAND strings on opposing sides of the vertical channel structure 550.

Using the structure of FIG. 11, a memory device is provided, comprising a plurality of stacks of conductive strips, the plurality of stacks including even stacks and odd stacks; a plurality of active pillars arranged between corresponding even and odd stacks of conductive strips in the plurality of stacks, active pillars in the plurality comprising even and odd vertical thin channel films having outside surfaces and inside surfaces, defining a multi-layer array of interface regions at cross-points between outside surfaces of the even and odd vertical thin channel films and conductive strips in the corresponding even and odd stacks of conductive strips; a 3D array of even memory cells in the interface regions accessible via the active pillars and conductive strips in the even stacks of conductive strips and odd memory cells in the interface regions accessible via the active pillars and conductive strips in the odd stacks of conductive strips, wherein the odd memory cells on a given active pillar are configured as a first NAND string, and the even memory cells on said given active pillar are configured as a second NAND string, and wherein the inside surfaces of the even and odd vertical thin channel films of said given active pillar are separated in the interface regions; conductive strips in an upper level in the even and odd stacks being configured as string select lines for both the first and second NAND strings on a given active pillar; conductive strips in intermediate levels in the even and odd stacks being configured as word lines for respective ones of the first and second NAND strings on a given active pillar; conductive strips in a plurality of lower levels in the even and odd stacks being configured as first and second ground select lines for both the first and second NAND strings on a given active pillar; a reference conductor beneath and connected to active pillars in the plurality of active pillars; and control circuitry configured to apply different bias voltages to the even and odd conductive strips.

Figure 12:
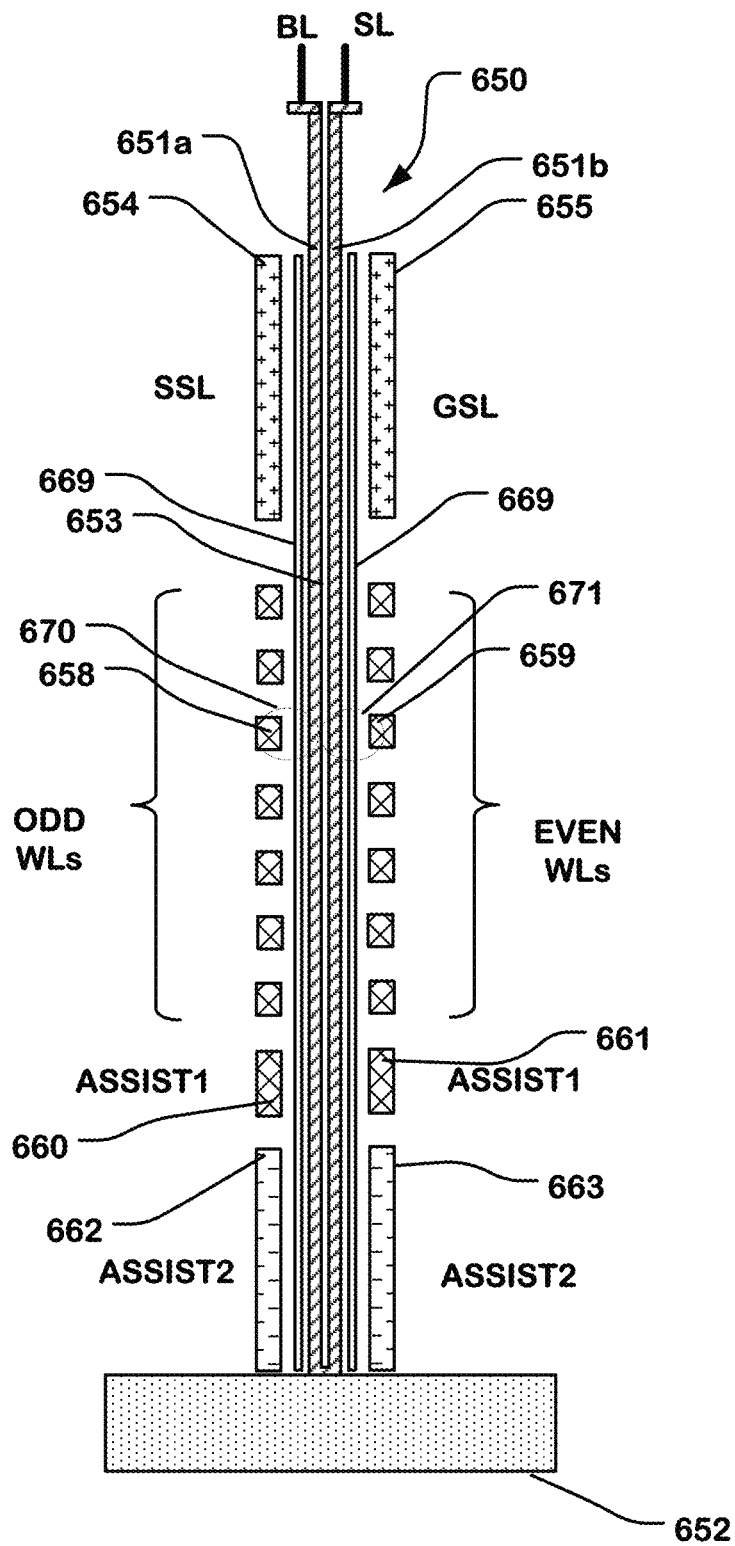
FIG. 12 is a heuristic cross-section of a vertical channel structure having a U-shaped vertical channel film in a 3D memory device, having first and second assist gates in lower levels.

FIG. 12 is a cross-section of a vertical channel structure implementing a U-shaped NAND string, like that described in U.S. Pat. No. 9,524,980 entitled U-SHAPED VERTICAL THIN-CHANNEL MEMORY, by Lue, issued Dec. 20, 2016, which is incorporated by reference in its entirety, as if fully set forth herein. The vertical channel structure 650, which includes a vertical polysilicon semiconductor body, including even and odd thin-channel films separated by a seam 653 along the length of the pillar, and is electrically connected at the bottom of the pillar. A charge storage element 669 is disposed on each side of the pillar. The vertical channel structure 650 includes an upper portion 651a providing a channel body for a string select line transistor on one side and an upper portion 651b providing a channel body for a ground select line transistor on the other side.

FIG. 12 illustrates conductive strips 654 and 655 configured as a string select line and a ground select line, respectively, both in the upper level of the stacks of conductive strips. The select line conductive strips 654 and 655 can include a more highly conductive film on the outside surfaces, such as a film of a metal silicide.

FIG. 12 also illustrates first assist gate lines 660 and 661 which can be implemented as conductive strips in lower levels of the stacks below the word lines, and second assist gate lines 662 and 663 which can be implemented as conductive strips in lower levels of the stacks below the first assist gate lines.

Likewise, conductive strips are disposed in intermediate levels as even and odd word lines on opposing sides of the vertical channel structure 650. Thus, an even word line 659 is disposed opposite an odd word line 658 in the structure. Eight word line layers are illustrated in this example. Of course, a larger number of word line layers, such as 16, 32, or more can be utilized.

In other embodiments, all or some of the string select lines, word lines and ground select lines are implemented using metal, or other conductive material, rather than polysilicon.

The structure illustrated in FIG. 12 provides memory cells 670, 671 having independent charge storage sites on the odd and even sides of the vertical channel structure 650. Also, the structure supports operating a single U-shaped NAND string extending along the opposing sides of the vertical channel structure 650.

The assist gate lines 660, 661 and assist gate lines 662, 663 in the structure illustrated in FIG. 12 act to provide lower select gates for the U-shaped NAND string, which must be operated in conjunction the upper select gates, which act as GSL and SSL lines.

A reference line structure, such as a line in a patterned metal layer, can be arranged orthogonally over the even and odd stacks of conductive strips and connected to the active pillar at the contact SL. A bit line structure, such as a line in a patterned metal layer, can be arranged orthogonally over the even and odd stacks of conductive strips and connected to the active pillar at the contact BL. The bit line structure and the reference line structure can be disposed in the same patterned conductor layer or different patterned conductor layers.

Using the structure of FIG. 12, a memory device is provided, comprising a plurality of stacks of conductive strips, the plurality of stacks including even stacks and odd stacks; a plurality of active pillars arranged between corresponding even and odd stacks of conductive strips in the plurality of stacks, active pillars in the plurality comprising even and odd vertical channel films having outside surfaces and inside surfaces, defining a multi-layer array of interface regions at cross-points between outside surfaces of the even and odd vertical channel films and conductive strips in the corresponding even and odd stacks of conductive strips, the even and odd vertical channel films are connected to form a current path from an upper end to a lower end of the even vertical channel film, and from a lower end to an upper end of the odd vertical channel film; a 3D array of even memory cells in the interface regions accessible via the active pillars and conductive strips in the even stacks of conductive strips and odd memory cells in the interface regions accessible via the active pillars and conductive strips in the odd stacks of conductive strips, wherein the even and odd memory cells on a given active pillar are configured as a NAND string; conductive strips in an upper level in the even stacks being configured as string select lines for the NAND string on a given active pillar; conductive strips in an upper level in the odd stacks being configured as ground select lines for the NAND string on a given active pillar; conductive strips in intermediate levels in the even and odd stacks being configured as word lines for the NAND string on a given active pillar; conductive strips in a plurality of lower levels in the even and odd stacks being configured as assist gates; and control circuitry configured to apply different bias voltages to the even and odd conductive strips.

Figure 13:
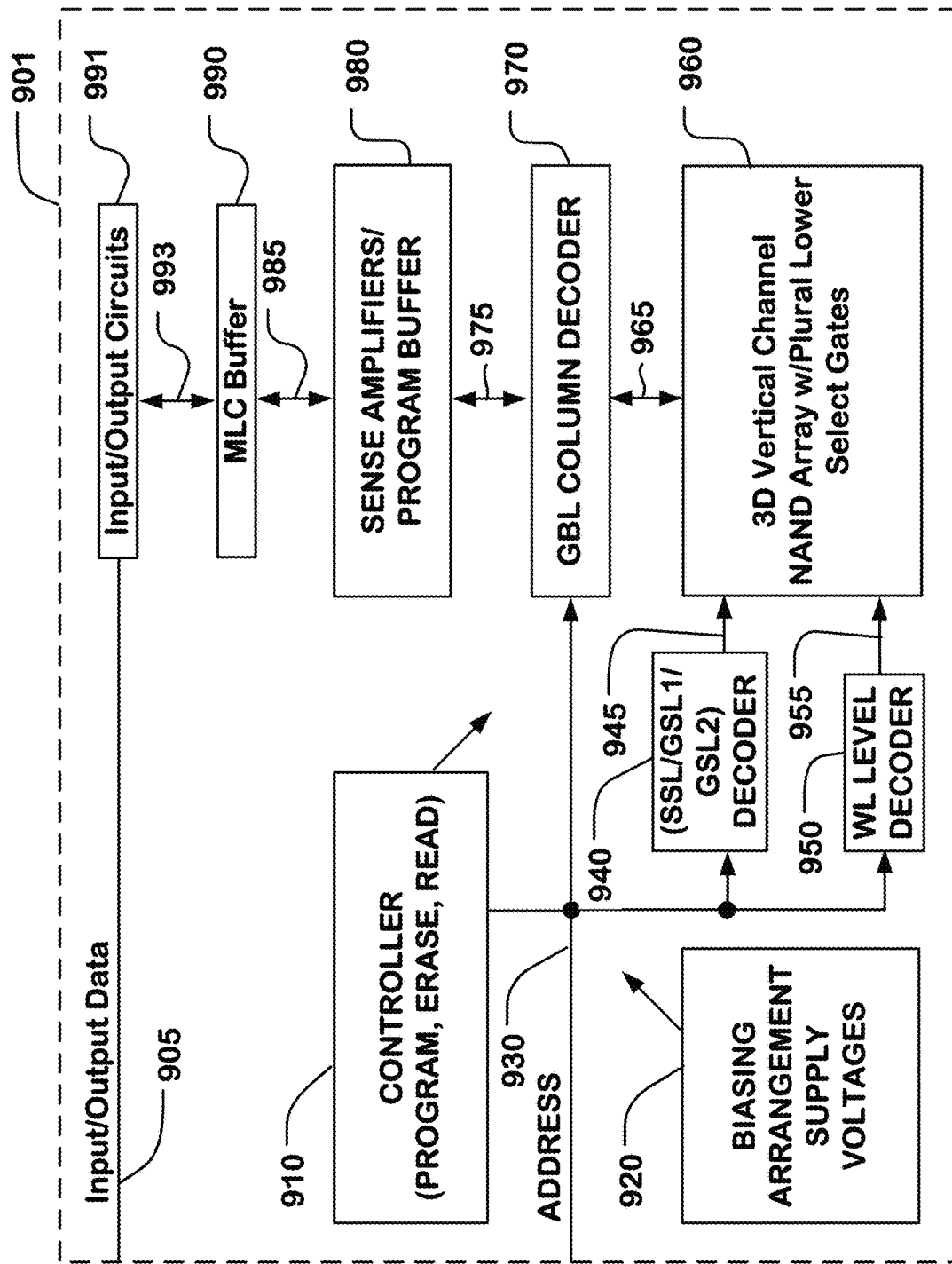
FIG. 13 is a simplified block diagram of an integrated circuit including a 3D NAND memory, having plural lower select gates.

FIG. 13 is a simplified chip block diagram of an integrated circuit 901 including a 3D, vertical NAND array. The integrated circuit 901 includes a memory array 960 including one or more memory blocks as described herein with vertical NAND strings arranged in blocks and sub-blocks as described herein, where the vertical NAND strings have a plurality of lower select gates as described herein.

An SSL/GSL1/GSL2 decoder 940 is coupled to a plurality of SSL lines 945, GSL1 and GSL2 lines arranged in the memory array 960. A word line level decoder 950 is coupled to a plurality of word lines 955. A global bit line column decoder 970 is coupled to a plurality of global bit lines 965 arranged along columns in the memory array 960 for reading data from and writing data to the memory array 960. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for single or multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 13, controller 910 includes control circuitry configured to apply voltages to the upper select line (e.g. SSL lines), to the word lines and to the first and second lower select lines (e.g. GSL1 and GSL2), using a bias arrangement state machine, that controls the decoders and drivers on the device for the application of supply voltages generated or provided through the voltage supply or supplies in block 920, for memory operations including read, erase, verify and program bias voltages. The controller 910 in this example is coupled to the multi-level buffer 990 and the memory array 960. The controller 910 includes logic to control multiple-level program operations.

The controller 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Technology is described that utilizes plural lower select gates in vertical NAND structures, and applies different routing arrangements to address process challenges for high density NAND. The technology provides flexibility to improve bottom layer controllability, and to achieve higher yield.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising:
an array of vertical channel structures;
an upper select line for vertical channel structures in the array, the upper select line comprising a conductive strip in an upper level;
word lines for vertical channel structures in the array, the word lines comprising conductive strips in intermediate levels below the upper level;
a first lower select line for vertical channel structures in the array, the first lower select line comprising a conductive strip in a first lower level below the intermediate levels;
a second lower select line for vertical channel structures in the array, the second lower select line comprising a conductive strip in a second lower level below the first lower level; and
control circuitry configured to apply voltages to the upper select line, to the word lines and to the first and second lower select lines.

2. The device of claim 1, including
a reference conductor below the array of vertical channel structures in electrical contact with a plurality of vertical channel structures in the array; and
a plurality of bit lines over the array of vertical channel structures in electrical contact with corresponding vertical channel structures in the plurality of vertical channel structures.

3. The device of claim 1, including
one or more patterned conductor layers overlying the array; and wherein
the first lower select line includes an interlayer conductor in a via connecting the conductive strip of the first lower select line to a first lower select line conductor in the one or more patterned conductor layers;
the second lower select line includes an interlayer conductor in a via connecting the conductive strip of the second lower select line to a second lower select line conductor in the one or more patterned conductor layers.

4. The device of claim 3, wherein the upper select line includes an interlayer conductor in a via connecting the conductive strip of the upper select line to an upper select line conductor in the one or more patterned conductor layers.

5. The device of claim 1, including
a third lower select line for vertical channel structures in the array, the third lower select line comprising a conductive strip in a third lower level below the second lower level, wherein the control circuitry is configured to apply voltages to the third lower select line;
one or more patterned conductor layers overlying the array; and wherein
the first lower select line includes an interlayer conductor in a via connecting the conductive strip of the first lower select line to a first lower select line conductor in the one or more patterned conductor layers;
the second lower select line includes an interlayer conductor in a via connecting the conductive strip of the second lower select line to a second lower select line conductor in the one or more patterned conductor layers; and
the third lower select line includes an interlayer conductor in a via connecting the conductive strip of the third lower select line to a third lower select line conductor in the one or more patterned conductor layers.

6. The device of claim 1, including
a second upper select line for vertical channel structures in the array, the second upper select line comprising a conductive strip in a second upper level above the first-mentioned upper level, wherein the control circuitry is configured to apply voltages to the second upper select line;
one or more patterned conductor layers overlying the array; and wherein
the first-mentioned upper select line includes an interlayer conductor in a via connecting the conductive strip of the first-mentioned upper select line to an upper select line conductor in the one or more patterned conductor layers;
the second upper select line includes an interlayer conductor in a via connecting the conductive strip of the second upper select line to the upper select line conductor in the one or more patterned conductor layers.

7. The device of claim 1, including memory cells at cross points of the vertical channel structures in the array and the word lines configured as NAND strings.

8. A device, comprising:
a memory including a block of vertical channel structures, the block of vertical channel structures including a plurality of sub-blocks;
sub-blocks in the plurality of sub-blocks each comprising
an upper select line for vertical channel structures in the sub-block, the upper select line comprising a conductive strip in an upper level;
word lines for vertical channel structures in the sub-block, the word lines comprising conductive strips in intermediate levels below the upper level;
a first lower select line for vertical channel structures in the sub-block, the first lower select line comprising a conductive strip in a first lower level below the intermediate levels;
a second lower select line for vertical channel structures in the sub-block, the second lower select line comprising a conductive strip in a second lower level below the first lower level; and
control circuitry configured to apply voltages to the upper select lines, to the word lines and to the first and second lower select lines in the plurality of sub-blocks.

9. The device of claim 8, including
a reference conductor below the block of vertical channel structures in electrical contact with a plurality of vertical channel structures in the block; and a plurality of bit lines over the block of vertical channel structures in electrical contact with corresponding vertical channel structures in the plurality of vertical channel structures.

10. The device of claim 8, including
one or more patterned conductor layers overlying the block; and wherein in first and second sub-blocks in the plurality of sub-blocks
the first lower select line includes an interlayer conductor in a via connecting the conductive strip of the first lower select line to a first lower select line conductor in the one or more patterned conductor layers;
the second lower select line includes an interlayer conductor in a via connecting the conductive strip of the second lower select line to a second lower select line conductor in the one or more patterned conductor layers; and
further wherein the second lower select line conductor is connected to the interlayer conductor of the second lower select line in both of the first and second sub-blocks.

11. The device of claim 10, wherein in the given sub-block, the upper select line includes an interlayer conductor in a via connecting the conductive strip of the upper select line to an upper select line conductor in the one or more patterned conductor layers.

12. The device of claim 8, including one or more patterned conductor layers overlying the block; and wherein sub-blocks in the plurality of sub-blocks include
a third lower select line for vertical channel structures in the sub-block, the third lower select line comprising a conductive strip in a third lower level below the second lower level;
wherein the control circuitry is configured to apply voltages to the third lower select lines in the plurality of sub-blocks; and
in first and second sub-blocks in the plurality of sub-blocks
the first lower select line includes an interlayer conductor in a via connecting the conductive strip of the first lower select line to a first lower select line conductor in the one or more patterned conductor layers;
the second lower select line includes an interlayer conductor in a via connecting the conductive strip of the second lower select line to a second lower select line conductor in the one or more patterned conductor layers; and
the third lower select line includes an interlayer conductor in a via connecting the conductive strip of the third lower select line to a third lower select line conductor in the one or more patterned conductor layers; and
further wherein the third lower select line conductor is connected to the interlayer conductor in of the third lower select line in both of the first and second sub-blocks.

13. The device of claim 8, including one or more patterned conductor layers overlying the block; and wherein sub-blocks in the plurality of sub-blocks include
a second upper select line for vertical channel structures in the sub-block, the second upper select line comprising a conductive strip in a second upper level above the first-mentioned upper level;
wherein the control circuitry is configured to apply voltages to the second upper select lines in the plurality of sub-blocks; and
in sub-blocks in the plurality of sub-blocks
the first-mentioned upper select line of the sub-block includes an interlayer conductor in a via connecting the conductive strip of the first-mentioned upper select line to an upper select line conductor for the sub-block in the one or more patterned conductor layers;
the second upper select line includes an interlayer conductor in a via connecting the conductive strip of the second upper select line to the upper select line conductor for the sub-block in the one or more patterned conductor layers.

14. A device, comprising:
a 3D NAND memory, including a block of vertical NAND strings, the block of vertical strings including a plurality of sub-blocks;
sub-blocks in the plurality of sub-blocks each a plurality of NAND strings comprising
an upper select line in an upper level;
word lines in intermediate levels below the upper level;
a first lower select line in a first lower level below the intermediate levels;
a second lower select line in a second lower level below the first lower level; and
control circuitry configured to apply voltages to the upper select lines, to the word lines and to the first and second lower select lines in the plurality of sub-blocks.

15. The device of claim 14, including
a reference conductor below the block in electrical contact with a plurality of vertical NAND strings in the block; and
a plurality of bit lines over the block in electrical contact with corresponding NAND strings in the block.

* * * * *